United States Patent [19]
Farace et al.

[11] Patent Number: 5,995,863
[45] Date of Patent: Nov. 30, 1999

[54] METHOD AND AN AUTOMATIC SYSTEM FOR OBTAINING WATER CONTENT AND ELECTRIC-PERMITTIVITY MAPS FROM MAGNETIC RESONANCE IMAGES

[75] Inventors: Paolo Farace, Trento; Rolando Pontalti, Marco - Rovereto; Luca Cristoforetti, Trento; Marina Scarpa; Renzo Antolini, both of Cognola, all of Italy

[73] Assignee: Instituto Trentino Di Cultura, Trento, Italy

[21] Appl. No.: 08/998,947

[22] Filed: Dec. 29, 1997

[30] Foreign Application Priority Data

Dec. 27, 1996 [IT] Italy ................................. TO96A1089

[51] Int. Cl.$^6$ ................................. A61B 5/055
[52] U.S. Cl. ......................... 600/410; 324/307; 324/312
[58] Field of Search ................................. 600/410, 407, 600/430; 324/307, 309, 310, 312

[56] References Cited

U.S. PATENT DOCUMENTS

| | | | |
|---|---|---|---|
| 5,228,443 | 7/1993 | Tatar | 600/410 |
| 5,361,763 | 11/1994 | Kao et al. | 600/410 |
| 5,841,288 | 11/1998 | Meaney et al. | 600/430 |

FOREIGN PATENT DOCUMENTS

| | | |
|---|---|---|
| 0099237 | 1/1984 | European Pat. Off. . |
| 0210038 | 1/1987 | European Pat. Off. . |
| 0470845 | 2/1992 | European Pat. Off. . |

OTHER PUBLICATIONS

Phys. Med. Biol., 1984, vol. 29, No. 11, pp. 1409–1419, Great Britain, "Microwave dielectric measurements (0.8–70GHz) on Artemia cysts at variable water content", J.S. Clegg, et al.

Leon Axel, etal. "Intensity Correction in Surface–Coil MR Imaging", American Roentgen Ray Society, Washington, DC, Apr. 1986, pp. 418–420.

S. Bondestam, et al. Tissue Characterization by Image Processing Subtraction: Windowing of Specific $T_1$ Values, Magnetic Resonance Imaging, vol. 10, pp. 989–995, 1992.

Joseph Borrello, MD, et al "Chemical Shift–based True Water and Fat Images: Regional Phase Correction of Modified Spin–Echo MR Images", Magnetic Resonance Imaging, vol. 164, #2, pp. 531–537, Aug., 1987.

G. Brix, et al, "MR imaging of fat–containing tissus: Valuation of two quantitative imaging techniques in comparison with localized proton spectroscopy", Magnetic Resonance Imaging, vol. 11, pp. 977–991, '93.

G. Brix, et al, "H–Spectroscopic Imaging Using a Modigied Dixon Method", Magnetic Resonance Imaging, vol., 6, pp. 617–622, 1988.

G. Brix, et al, "Evaluation of proton density by magnetic resonance imaging: phantom experiments and analysis of multiple component proton transverse relaxation". Phys. Med. Biol, 1990, vol.35, No. 1,53–66.

B. Condon, et al, "Image non–uniformity in magnetic resonance imaging: its magnitude and methods for its correction", The British Journal of Radiology, 60, pp. 83–87, Jan., 1987.

(List continued on next page.)

*Primary Examiner*—Ruth S. Smith
*Attorney, Agent, or Firm*—Sughrue, Mion, Zinn, Macpeak & Seas, PLLC

[57] ABSTRACT

Magnetic resonance images (NMR, MRI) are subjected to quantitative analysis of the water content of individual regions of the images, preferably with treatment of relaxation effects, correction for non-uniformities, and taking account of the possible presence of fat tissue. Respective electric-permittivity values can be generated from the aforementioned water-content maps to produce electric-permittivity maps of the object observed.

10 Claims, 15 Drawing Sheets

OTHER PUBLICATIONS

P. Dimbylow et al, "SAR calculations in an anatomically realistic model of the head for mobile communication transceivers at 900 MHz and 1.8 GHz", Phys. Med. Biol. 39 (1994), pp. 1537–1553.

W.T. Dixon, "Simple Proton Spectroscopic Imaging", RSNA, vol. 153, #1, Oct. 1984, pp. 189–194.

R. Ernst et al, "Application of Fourier Transform Spectroscopy to Magnetic Resonance", The Review of Scientific Instruments, vol. 37, #1, Jan. 1966, pp. 93–102.

John Ford, et al, "In Vivo Quantitative Characterization of Trabecular Bone by NMR Interferometry and Localized Proton Spectroscopy", Magnetic Resonance in Medicine 17, 543–551 (1991).

G. Glover, "Multipoint Dixon Technique for Water and Fat Proton and Susceptibility Imaging", JMRI, Sep./Oct. 1991, pp.521–530.

S. Hornsleth et al, "A New CT Segmentation Algorithm for Finite Difference Based Treatment Planning Systems", 7th Int'l Congress on Hyperthermic Oncology, Rome, Italy, Apr. 9–13, 1996, pp. 521–523.

B. James et al, "Direct Use of CT Scans for Hyperthermia Treatment Planning", IEEE Transactions on Biomedical Engineering, vol. 39, #8, Aug. 1992, pp. 845–851.

H. Kauczor, et al, "Bone Marrow After Autologous Blood Stem Cell Transplantation and Total Body Irradiation: Magnetic Resonance and Chemical Shift Imaging", Magnetic Resonance Imaging, vol. 11, 1993 pp. 965–975.

C. Lodes et al, "Proton MR Chemical Shift Imaging using Double and Triple Phase Contrast Acquisition Methods", J Comput Assist Tomogr, vol. 13, No. 5, 1989, pp.855–861.

P. Mansfield et al, "NMR Imaging in Biomedicine", Academic Press, NY, 1982, pp. 10–31.

R. Pontalti et al, "The frequncy dependent FDTD method for multi–frequency results in microwave hyper–thermia treatment simulation", Phys. Med. Bio. 38 (1993), pp. 1283–1298.

J. Schepps et al, "The UHF and microwave dielectric properties of normal and tumour tissues: variation in dielectric properties with tissue water content", Phys. Med. Biol., 1980, vol. 25, #6, pp. 1149–1159.

S. Song et al, "Phase Unwrapping of MR Phase Imagse Using Poisson Equation", IEEE Transactions on Image Processing, vol. 4, #5, May, 1995, pp. 667–676.

S. Smith et al, "Dielectric properties of low–water–contents tissues", Phys. Med. Biol., 1985, vol. 30 No. 9, pp. 965–973, Great Britain.

J. Szumowski et al, "Phase Unwrapping in the Three–Point Dixon Method for Fat Suppression MR Imaging" Magnetic Resonance Imaging, vol. 192, #2, Aug. 1994, pp.555–561.

F. Wehrli et al, "Chemical Shift–induced Amplitude Modulations in Images Obtained With Gradient Refocusing", Magnetic Resonance Imaging, vol. 5, pp. 157–158, 1987.

D. Wicks et al, "Correction of Intensity Nonuniformity in MR Images of any Orientation", Magnetic Resonance Imaging, vol. 11, pp. 183–196, 1993.

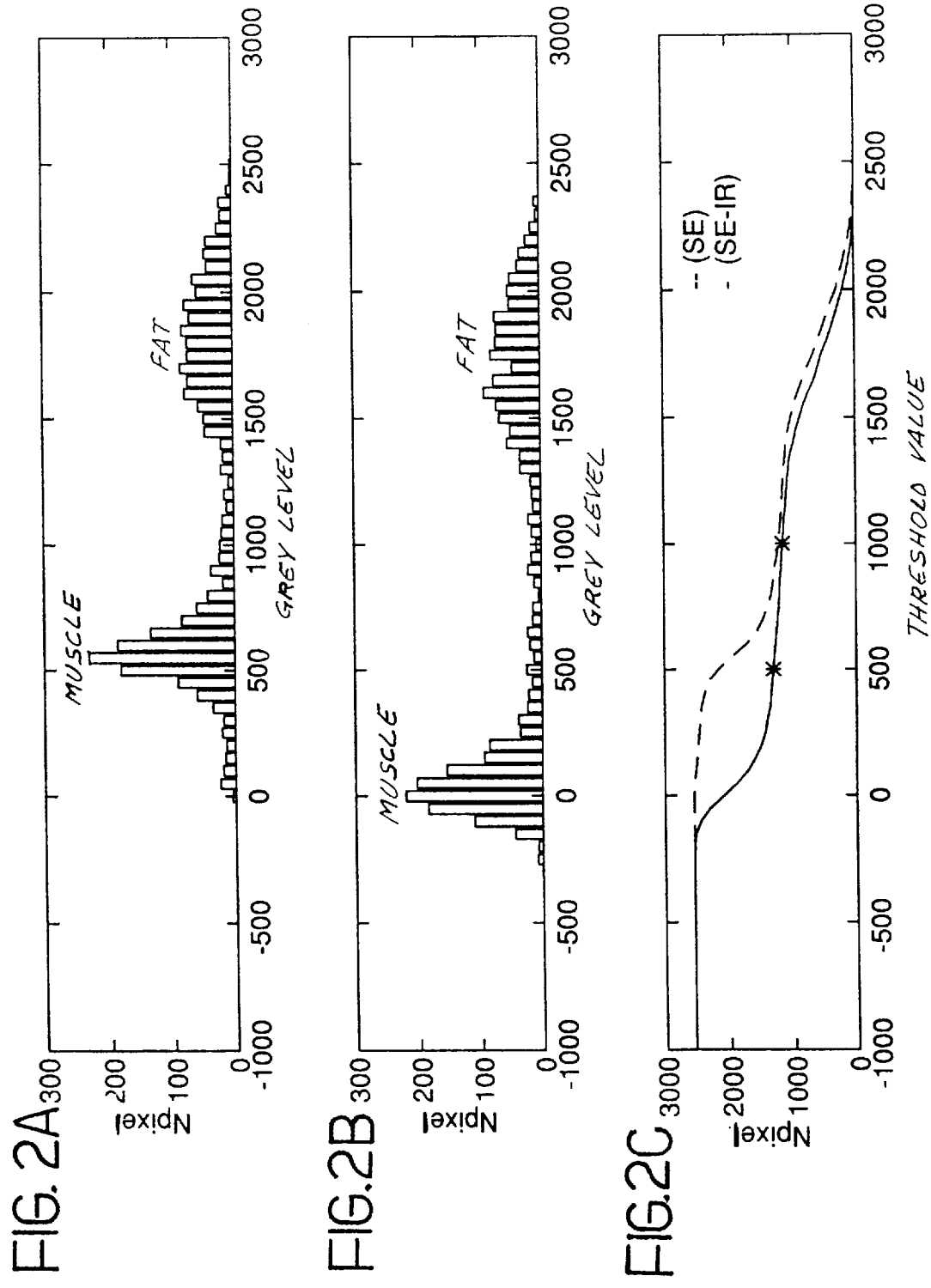

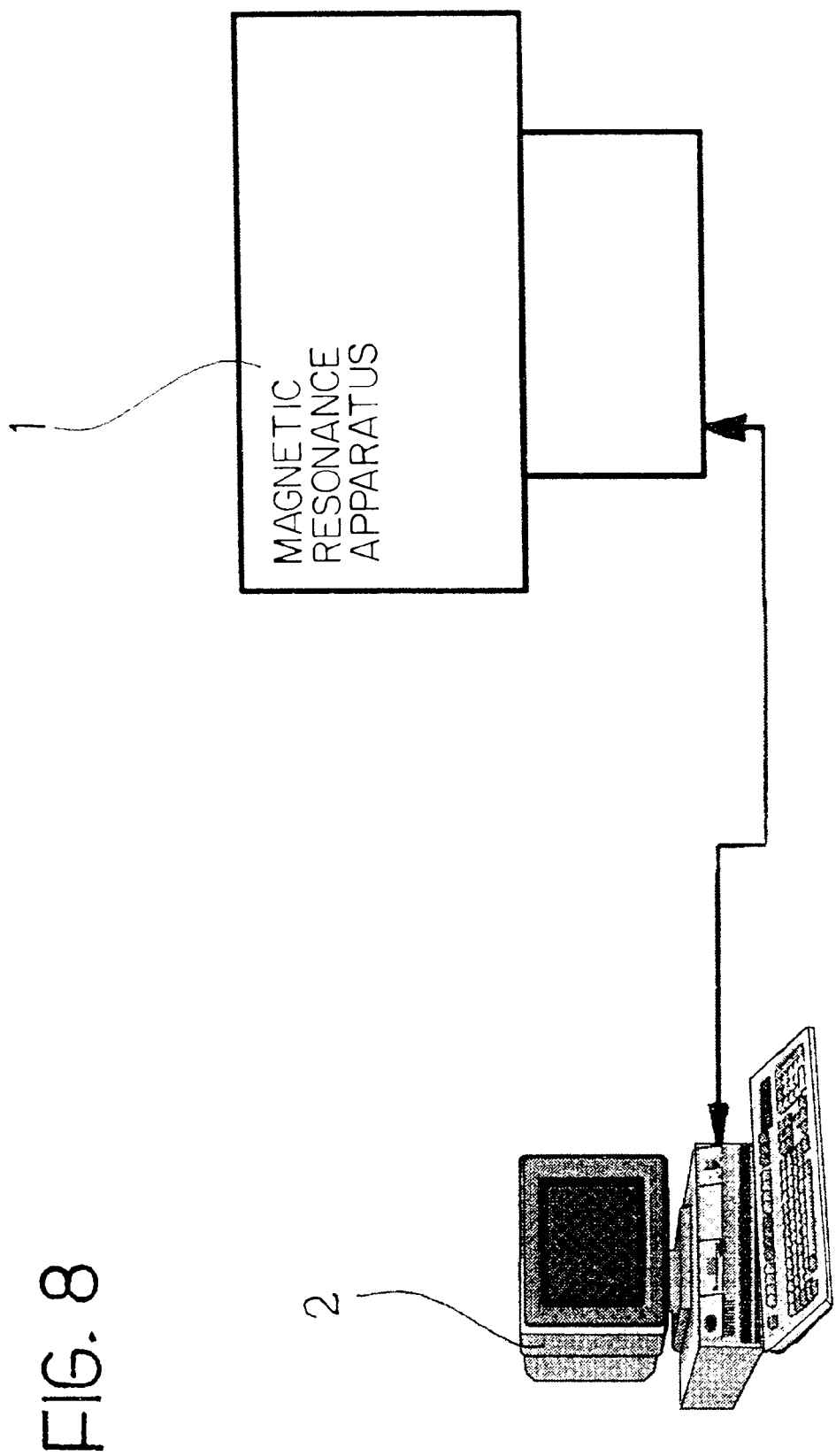

METHOD AND AN AUTOMATIC SYSTEM FOR OBTAINING WATER CONTENT AND ELECTRIC-PERMITTIVITY MAPS FROM MAGNETIC RESONANCE IMAGES

DESCRIPTION

1. Field of the invention

The present invention relates to the problem of detecting the water content and/or the complex physical permittivity quantity by analysis of a magnetic resonance signal, this term relating, in particular, to nuclear magnetic resonance (or briefly, NMR) signals and magnetic resonance imaging (or briefly MRI).

In these techniques, measurement usually takes place by analysis of attributes of the signal amplitude and phase. The variations of these attributes for a certain NMR sequence as a result of variations in the corresponding physical quantity in the medium subjected to measurement are of particular interest.

The present invention has been developed with particular attention to its possible application for the purposes of determining the power deposited in biological structures by antennae which radiate electromagnetic energy, for example, for the development of treatment planning in hyperthermic oncological treatment with microwaves and, more generally, in treatment which involves the use of electromagnetic fields.

For this reason, the present description will refer mainly to this application in which the physical quantity forming the subject of investigations is in fact the complex permittivity of biological tissues of the human body.

The invention is not, however, limited to this specific field of application.

In particular, upon the premise that the use of the magnetic resonance signal for the purposes of measurement and point- or matrix-quantification of the complex permittivity quantity implies, according to the invention, the existence of a functional relationship between the signal, the water content and the physical quantity, it is possible to identify fields of application other than that described above, in which this functional relationship may be used.

By way of example, the following fields of application may be mentioned:

radio-protection simulations (for transmitters, cellular phones, etc . . . -for example, for the definition of numerical standards of anthropomorphic phantoms);

biomedical applications in which variations of biological or physiological quantities may occur in terms of variation of the water content and/or complex permittivity;

industrial processes (drying of materials, cooking of foods, etc.) using radio-frequency energy and/or microwaves, and industrial processes (drying of materials, cooking of foods, etc.) in which checks are performed using measurement of the above-mentioned physical quantities.

2. Description of the Prior Art

Both in the provision of a short description of the prior art and in the detailed description of embodiments of the present invention, extensive reference will be made below to bibliographical references. These references are made simply by an indication of the authors' names and the year of publication. To avoid overloading the description, full particulars of the references quoted are given in a bibliographical synopsis at the end of the present description.

Radio-frequency or microwave hyperthermia is accepted to an ever increasing extent as an adjuvant to radiation therapy as a method of treating both superficial and deep-seated tumours. Deep heating involves the use of an array of applicators operating at different amplitudes and phases. These parameters, along with the working frequency, have to be chosen to focus the power in the target region. The complexity of this process, which could be prohibitive even for a highly skilled operator, requires the use of computerized treatment plans. For this purpose, simulation techniques such as the method known as the FD-TD (Finite-Difference Time-Domain) method which permits calculation of the distribution of electromagnetic power in a set of numerical cells representative of the volume to be treated (see, for example, the reference Pontalti et al., 1993 in the synopsis at the end of the present description) have been proposed. These methods require as a data input a three-dimensional complex permittivity map for each patient. However, a model of the anatomical structure must be derived by means of diagnostic tomography such as CT (Computer Tomography, generally called CAT, that is, computerized axial tomography) and MRI.

Permittivity maps could be obtained by tissue segmentation and subsequent data assignment on the basis of published values (Dimbylow and Mann, 1994). However, segmentation does not account for the permittivity changes throughout the same tissue or for individual variations of the properties of a given tissue. Moreover, this process needs complex and time-consuming manual operations.

Thus it can be expected that a computer-base form of treatment planning will become of current clinical use only when maps of electric parameters of the tissues can be created automatically for each patient.

Methods of converting the patient's CT scans directly into values of dielectric properties have already been suggested (James and Sullivan, 1992, Hornsleth et al., 1996). The proposed relationships between complex permittivities and Hounsfield values were empirical step-wise functions defined in order to separate tissue types into fat, connective tissue, muscle and bone. Inside each region, a constant permittivity was assumed and the Hounsfield thresholds were selected by empirical criteria (as in the case of James and Sullivan, 1992) or by histogram pixel-value evaluation (Hornsleth et al., 1996). Therefore, such methods can be seen at most as automatic tissue-segmentation methods but cannot be considered true, even though indirect, measurements of permittivity.

OBJECTS AND SUMMARY OF THE PRESENT INVENTION

The solution according to the invention, which has the characteristics recited in the following claims, enables the magnetic resonance signal values to be converted automatically into permittivity values and/or enables the water content to be measured so that the complex permittivity can be correlated with the water content of the tissues.

In images obtained by magnetic resonance, the intensity of the signal is in part due to the component relating to water, and water largely contributes to the electromagnetic properties of the tissues. The permittivity of the tissue can be correlated with the water content by monotonic relationships derived by the mixture theory, as previously suggested (Schepps and Foster, 1980, Smith and Foster 1985). Besides having deep physical implications, these monotonic equations allow errors in permittivity evaluation caused by the use of the step-wise functions described above to be reduced.

In particular, according to the invention, water-content maps can be obtained with the use of a gradient-echo pulse sequence. Relaxation effects can be avoided by the use of long repetition times and by multi-echo acquisition followed by single exponential decay fitting. The contribution of fat tissue to the magnetic resonance signal and its low permittivity values require particular care in the assignment of permittivity values to tissue of this type.

For this purpose, the currently-preferred embodiment of the invention provides for the possibility of using at least two different methods in order to treat fat tissues appropriately: a segmentation technique and a water-content evaluation by chemical shift imaging (CSI) techniques.

To obtain true quantitative maps it is necessary to correct for non-uniformity of spatial intensity and possibly to perform a calibration procedure.

The solution according to the invention allows permittivity maps to be obtained from images acquired by a conventional whole-body magnetic resonance imaging device. Since contrast is generated not only by water but also by fat tissues and is affected by the signal relaxation, a method of operating which eliminates these undesired contributions has been defined.

The creation of the maps is represented in summary by the following two steps:

quantitative voxel-by-voxel evaluation of tissue water content from a set of magnetic resonance images, and computation of permittivity maps through the monotonic relationships mentioned above.

BRIEF DESCRIPTION OF THE DRAWING

The invention will now be described, purely by way of non-limiting example, with reference to the appended drawings, in which:

FIGS. 2A–2C and 3A–3B show the results of successive steps in the processing of magnetic resonance images in the method according to the invention, FIGS. 4A, 4B; 5A, 5B and 6A, 6B show the result of further processing steps at image level, particularly with regard to the mapping of the percentage water content (FIGS. 6A and 6B), FIG. 8 shows schematically a typical configuration of a system according to the invention.

Figure 1A:
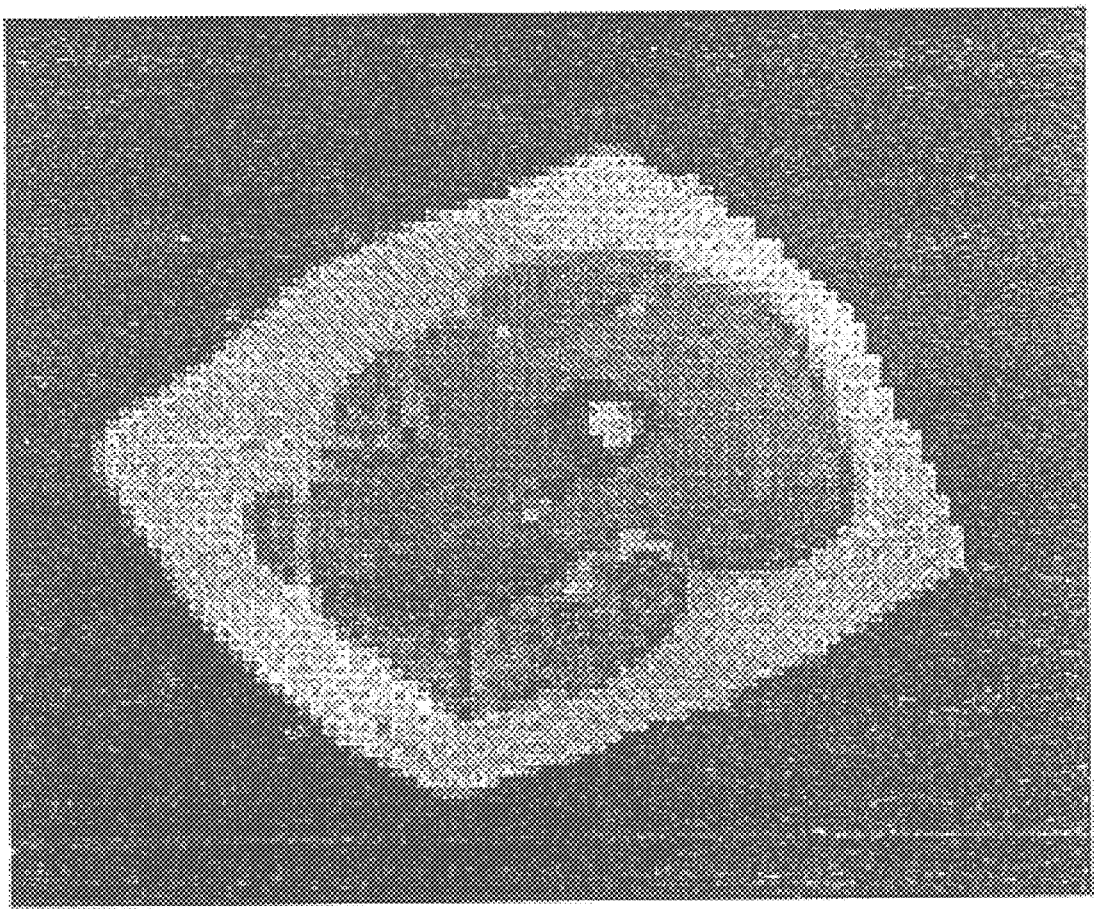
FIGS. 1A to 1D show magnetic resonance images usable in the solution according to the invention.

Once again, it is pointed out that the bibliographical references given in the course of the present description are to be found in the bibliographical synopsis at the end of the description.

DETAILED DESCRIPTION OF THE INVENTION

As shown schematically in FIG. 8, the system according to the invention can be implemented with the use of normal, conventional magnetic resonance apparatus, indicated 1. In particular, the examples given below relate to investigations carried out with a Matgnetom Impact 1T tomograph with a static magnetic field produced by the company Siemens of Erlangen (Federal Republic of Germany). This apparatus comprises a whole-body scanning winding or coil which demonstrates an excellent degree of homogeneity of the magnetic field (B1). The processing can be performed on a control devices such as a personal computer 2 with the use of commercially-available computation software, for example, Matlab, from The MathWorks, Inc.

In particular, the data given below were obtained with the use of various phantoms used in order to set up the procedures for suppressing the fat content by means of the technique known as chemical shift imaging (CSI), spatial non-uniformity correction, and image-intensity calibration.

The phantoms used for setting up the CSI technique were prepared on the basis of an agar-agar gel (0.8% by weight) buffered at a pH 7.4 and containing various amounts of pork fat tissue (44%, 34%, 10% and 0% by weight). The ground tissue was mixed with the agar-agar at 70° C., the suspension was then whisked with the subsequent addition of 1% by weight of sodium dodecylsulphate to obtain a homogeneous emulsion. Gadolinium (Magnevist, Schering) was then added to obtain a 200 msec $T_1$ value (the longitudinal relaxation-time value). The final volume was about 30 ml and the final water content was measured by weighing the phantoms before and after a dehydration procedure.

The phantom for spatial non-uniformity correction consisted of a 33 cm-diameter cylindrical soft plastics container filled with 5 litres of a solution of sodium chloride and gadolinium in water.

The phantom used for calibration of image intensity consisted of four plastics bags each with a volume of one litre, filled with a solution of gadolinium in water.

Tests Carried Out

The FDTD (Finite Difference Time Domain) cell side in microwave hyperthermia treatment planning ranges from about 1–2 mm for superficial, interstitial and intracavitary hyperthermia to 1 cm for regional hyperthermia. For this reason, in all of the MRI measurements considered below, a mean value of 3 mm was used for the voxel side of the images. This voxel dimension gives a field of view of 384×384 $mm^2$ with a spatial resolution of 128×128 pixels.

Treatment of Relaxation Effects

A gradient-echo sequence was used to acquire proton-density weighted images. Unless expressly indicated, the $T_1$ effect on image intensity was ignored. In fact, with the use of an excitation pulse which rotates the magnetization vector through an angle—called the flip angle—of 18° and a relaxation delay of 1.5 seconds, full relaxation Was allowed.

Since the $T_2^*$ values (experimental decay time due both to the transverse relaxation-time value $T_2$ and to the non-homogeneity of the magnetic field) were shown to depend on the tissue type and location (as described further below), a multiple-echo acquisition was performed to correct the effects concerned. The images were processed pixel-by-pixel, upon the assumption of a signal intensity decreasing with time as a single exponential function with a $1/T_2^*$ time constant. By interpolating with this function the signal intensity at various echo times (TE), usually selected as 6, 10, 14 and 18 ms, it was possible to extrapolate the image at TE=0. The maps thus obtained, no longer affected by relaxation effects, were in fact water-content images except for the fatty regions.

Treatment of Fat Tissues

In standard $^1H$ MRI techniques (that is, standard tomography by proton magnetic resonance) the signal intensity depends on the contributions of fat and of water. Since fat tissue is largely present in the human body and, despite its low permittivity values, gives high signal intensity, it is useful to carry out a specific treatment for tissues of this type. Furthermore, fat tissue plays a special role in hyperthermia because so-called hot spots often occur inside fat layers and at their interfaces with tissues having a high water content.

In order to treat the fat tissue appropriately, two procedures were tested.

In the first place, fat-rich tissues were located by segmentation on the basis of a thresholding operation, followed by the assignment of tabulated permittivity values to the segmented region.

In the fat pixels identified as indicated above, the water and fat contribution to the proton images was evaluated. This was done by chemical shift techniques (so-called CSI techniques, as documented in Dixon 1984). The obtained true water content of the tissue can be used to calculate the permittivity values.

Figure 1B:
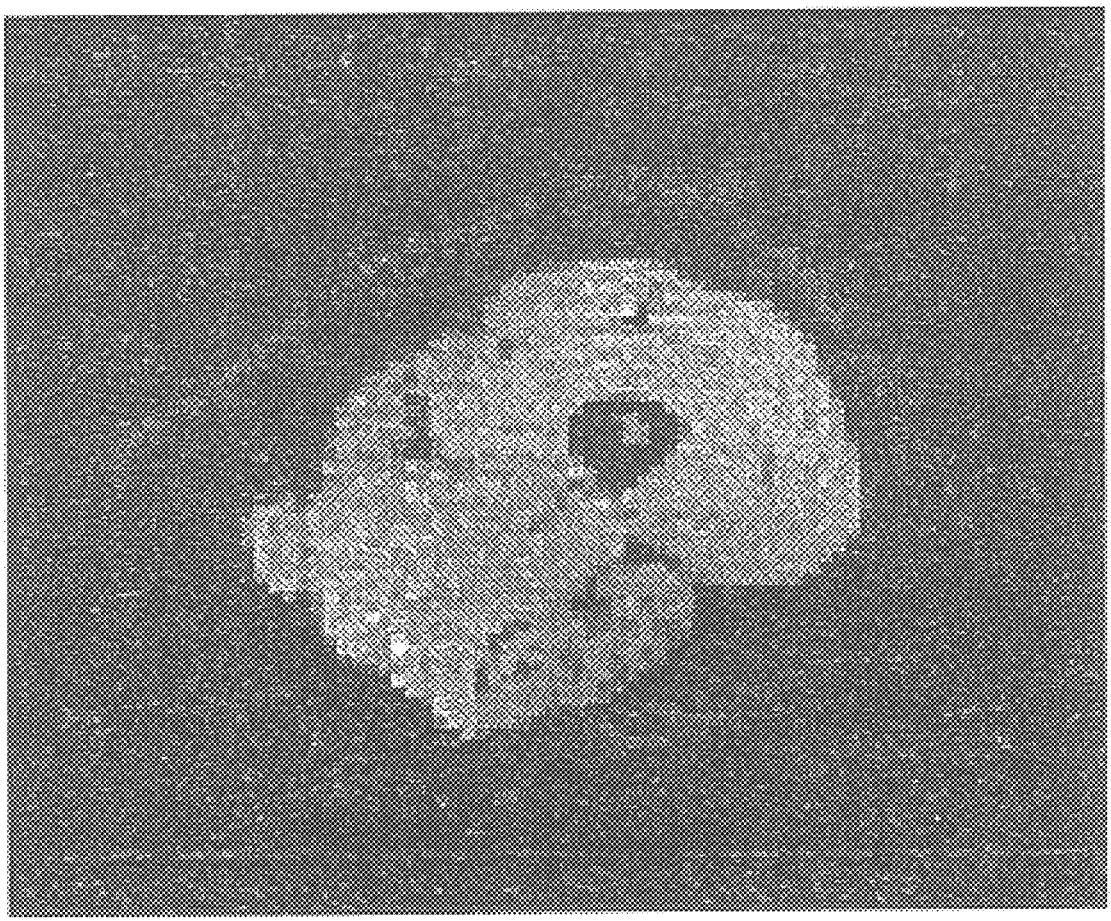

On the basis of the first procedure, the fat regions were identified by thresholding of the image obtained by the subtraction method proposed by Bondestam et al., 1992. A first image (M1—FIG. 1A) and a second image (M2—FIG. 1B) with a hyperintense and a hypointense fat signal, respectively, were acquired. The image M1 was acquired by a $T_1$-weighted SE sequence (450 ms repetition time and 20 ms echo time). The image M2 was acquired by an inversion-recovery sequence (1800 ms repetition time, 20 ms TE and 150 ms inversion time). The two images were corrected for spatial non-uniformity (as explained further below) and M2 was then subtracted from M1.

Hornsleth et al., 1966 proposed that the histogram of the pixel values in a volume covered by a series of CT slices can be used to define different thresholds to identify different tissues. Accordingly, FIG. 2 of the appended drawings shows the histogram of the pixel intensities of M1 (FIG. 2A) and of M1–M2 (FIG. 2B). Both histograms show two distinct distribution curves which can be assigned to fat-poor tissues (lower grey levels) and fat-rich tissues (higher grey levels). The separation between the two distribution curves in the histograms of M1–M2 is increased in comparison with that of the image M1 since the subtraction procedure has the effect of depressing the intensity in fat-poor tissues.

A thresholding technique was used to locate the regions of intense signal and FIG. 2C shows the number of segmented pixels as a function of the threshold value for the image M1 (broken line) and the image M1–M2 (continuous line).

These curves show the presence of a flat central zone where the number of segmented pixels is independent of the threshold value. This indicates a low risk of incorrect results due to an arbitrary choice of the threshold value by the operator when the contrast between fat tissue and the other tissues is as high as in the image M1–M2.

Figure 1C:
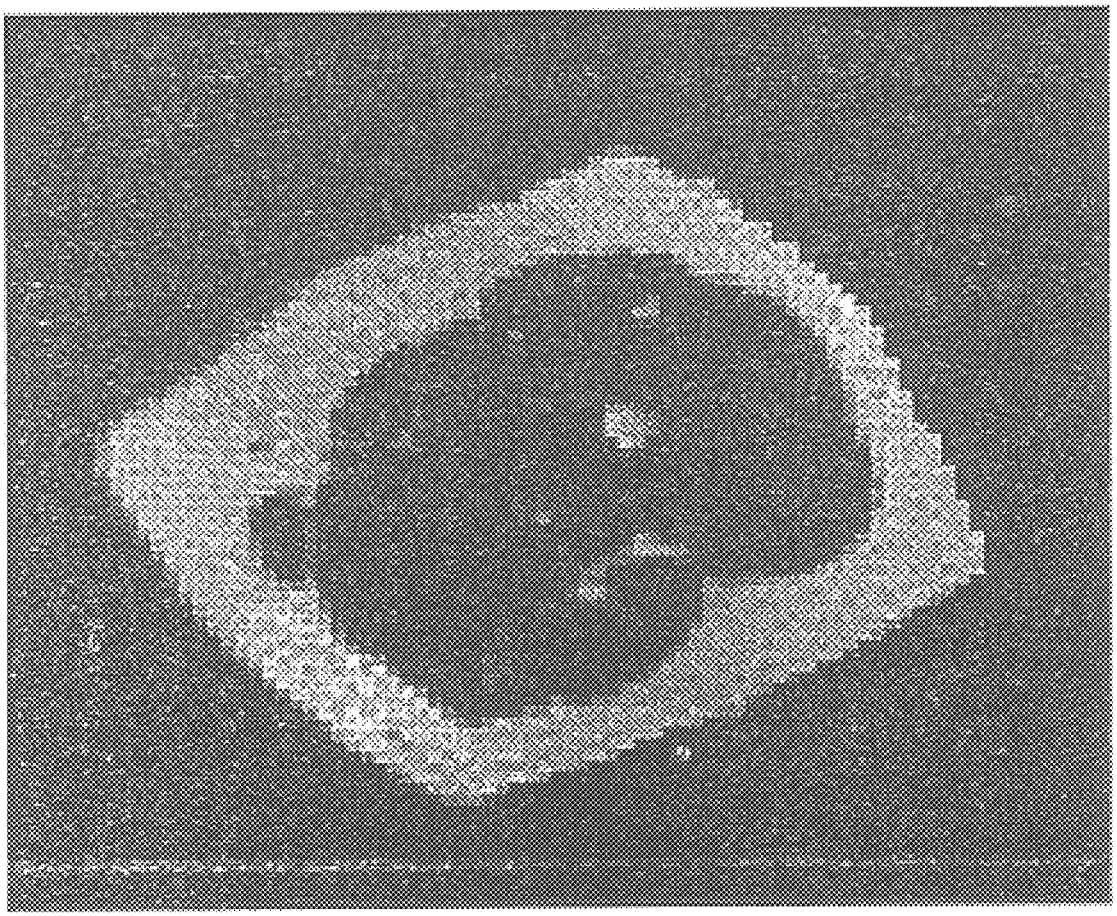
Figure 1D:
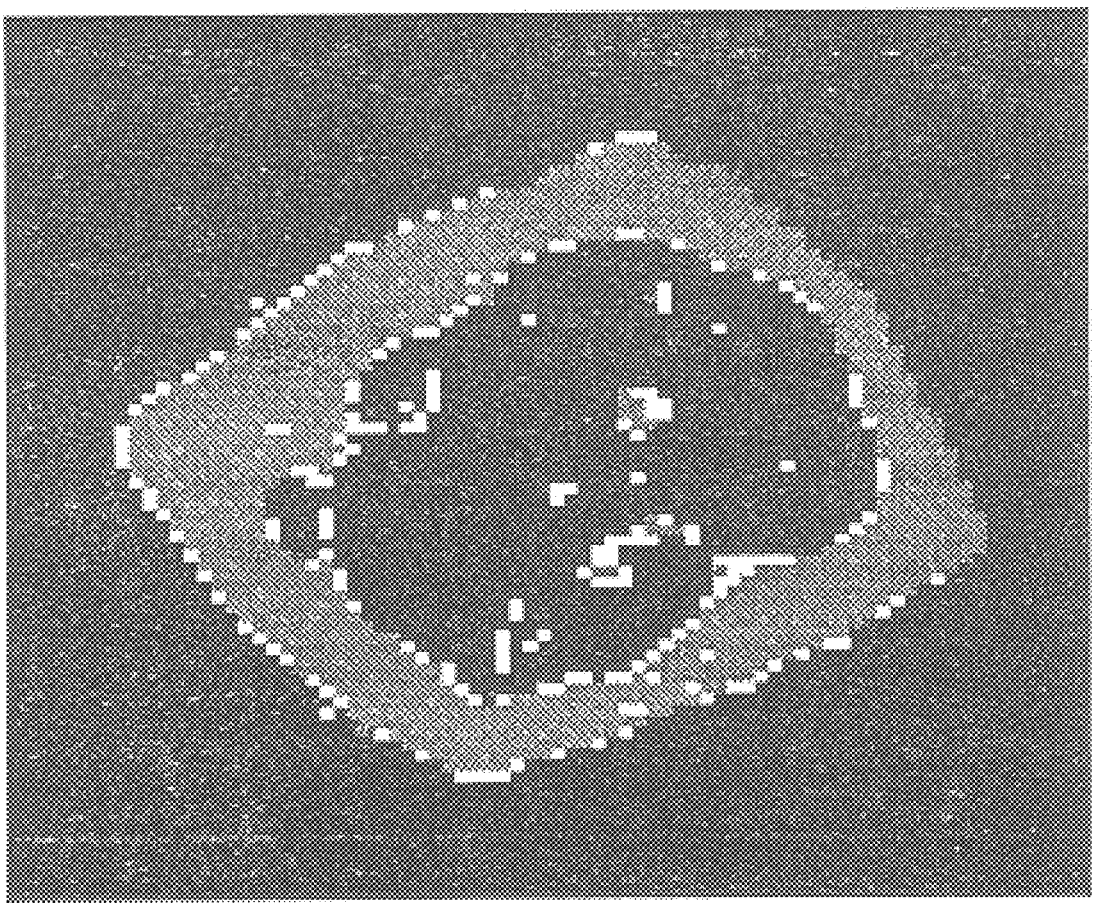

FIG. 1D shows the image obtained if 500 and 1000 values are taken as threshold values in the image M1–M2 (image of FIG. 1C). In the image M2, the fat-rich tissue regions selected by both threshold values appear grey and the pixels selected only by the threshold value 500 appear white. The positions of the white pixels all around the boundary region between fat and other tissues suggest that their selection solely by the 500 threshold value can be attributed to partial volume effects.

The permittivity values tabulated for fat tissue can be assigned to the selected regions. Moreover, the scattered permittivity values of fat tissues reported in the literature indicate that these data are affected by wide variability, probably related to differences in the water content of the tissues. This variability limits the application of the segmentation procedure. It therefore appears advisable to calculate permittivity values based on a true water-content evaluation by the CSI technique.

The chemical-shift-induced amplitude modulation of the signal was therefore measured by a gradient-refocusing proton chemical shift technique (Wherly et al., 1987). A gradient-echo pulse sequence implemented in known manner on the apparatus 1 was used with stepping of the echo delay (TE). Since the shift between the signal relating to water and the signal relating to fat at 1T is $f_{cs} \approx w/2\pi \approx 167$ Hz, an increase of about 7 ms enabled the water and fat signals to be acquired in phase and out of phase by 180°, respectively (Glover 1991). The signal intensity as a function of dephasing time (TE) shows a decay with the characteristic chemical-shift amplitude modulation.

According to Wherly et al., the following equation is true for I (TE)

$$I(TE) = \left| \sum_i I_i \right| = \sqrt{\sum_i \sum_j I_i I_j \cos[\Delta\omega_{ij} TE + \Delta\phi_{ij}]} \quad [1.1]$$

where $I_i$ is the quadrature signal of the i-th spectral component, $\Delta w_{ij}$ is the frequency difference between the components i and j, and $\Delta\phi_{ij}$ is the initial phase between the i-th component and the j-th component.

$I_i$ can be expressed as $$I_i = I_0 \exp(-TE/T^*_{2i}) \quad [1.21]$$

and represents the $T_2^*$-weighted modulus signal amplitude of the i-th component with the summation extending over all of the spectral components. To simplify the procedure, it can be assumed that, with a field strength 1T, the various spectral components of the fat (CH3, CH2, CH) are not resolved and it is thus possible to take into consideration only the water spectral component (W) and a fat spectral component (F). Five independent parameters ($I_{W0}$, $I_{F0}$, $T^*_{2W}$, $T^*_{2F}$ and $\Delta\phi_{ij}$) are thus to be measured. To estimate them, images were obtained for seven TE values (6, 8, 10, 12, 14, 16, 18 ms, respectively) and a multi-parameter, non-linear interpolation to the equation [1] given above was then performed. The $I_{W0}$ value obtained by the interpolation was used to compute the images of water content in the tissues.

The accuracy of the protocol to acquire the water images by a CSI selective technique was verified by means of the four homogeneous tissue phantoms containing water and pork fat described at the beginning of the present detailed description.

Table 1 below gives the water content calculated from the MRI data and that measured by dehydration.

TABLE 1

| Water content | |
|---|---|
| MRI measurements | dehydration tests |
| 0.59 ± 0.04 | 0.45 ± 0.05 |
| 0.64 ± 0.03 | 0.58 ± 0.05 |
| 0.97 ± 0.02 | 0.84 ± 0.05 |

The water content calculated from the MRI data appears overestimated in comparison with that measured by dehydration of the samples containing high fat concentrations. This systematic error is a consequence of the Dixon method and has been discussed in detail by Brix et al., 1993.

Essentially, the problem inherent in the Dixon technique is a possible incorrect assignment of the computed magnetizations to water and to fat (see also Brix et al., 1988). It should, however, be noted that, when the technique described herein was applied in vivo, the signal intensities obtained from the interpolation were assigned to water and to fat considering that the condition $I_{F0}>I_{W0}$ is always satisfied in the pixels belonging to fat-rich tissues previously identified by the segmentation technique described above.

It should also be noted that the problems inherent in the Dixon technique can be overcome by a phase-sensitive reconstruction method that records the sign of magnetization (see Lodes et al., 1989, Borrello et al., 1987, Szumowski et al., 1994, Song et al., 1995).

Non-uniformity Correction and Quantitative Reference Standard

Several sources of non-uniformity usually adversely affect magnetic resonance images, hindering quantitative analysis. These sources are mainly due to the instrument rather than to the object being imaged and, in particular, to non-uniformity of the radio-frequency B1magnetization field and of the static and gradient fields (Wicks et al., 1993). However, a smaller influence of some parameters specific to the analyzed object, such as radio-frequency penetration effects, cannot be excluded (Condon et al., 1987). To quantify the influence of these effects on the accuracy of the tissue water-content data, the image of a uniform phantom such as that described above was acquired. The image showed non-uniformity effects similar to those observed by Condon et al., 1987. In particular, moving from the centre towards the image boundaries, the signal decreased markedly in the horizontal direction and increased slowly in the vertical direction. To correct the non-uniformity in slices of the MRI image, the method described by Axel et al., 1987 was adopted in a slightly modified form. In particular, the images of the uniform phantom and of the tissues were acquired in the same positions inside the coil for four echo time values. After noise filtering with a 3×3 gaussian filter, the dependence of the signal intensity on $T_2^*$ was corrected by the interpolation procedure described above and the image of the two objects for a zero echo time was computed. The image of the object was divided by the image of the phantom. A threshold was used to mask the background.

Figure 3A:
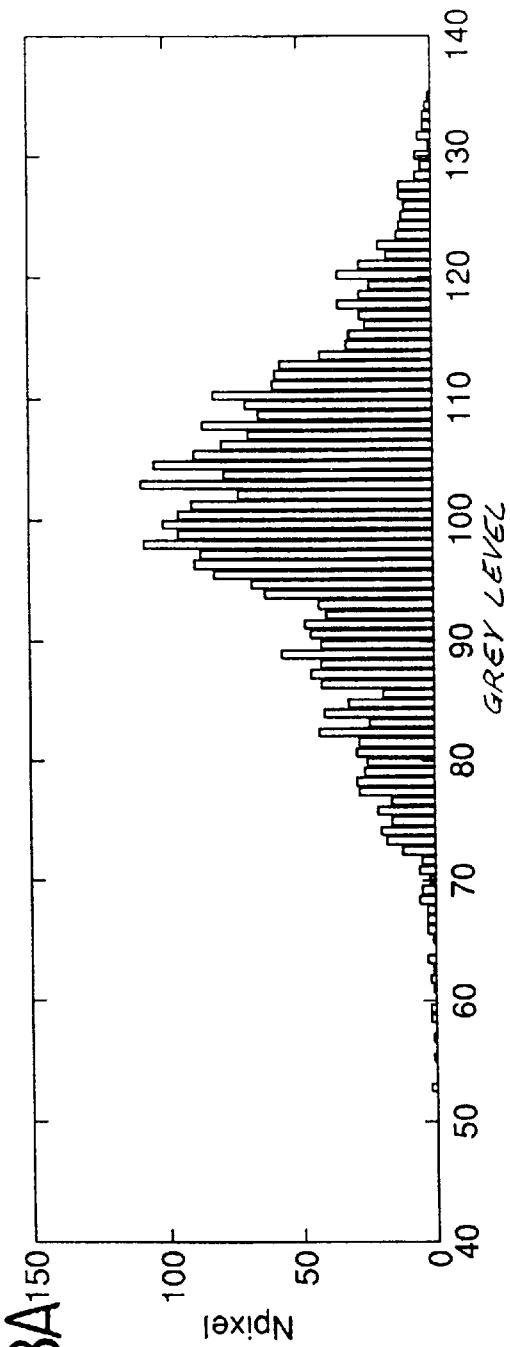
Figure 3B:
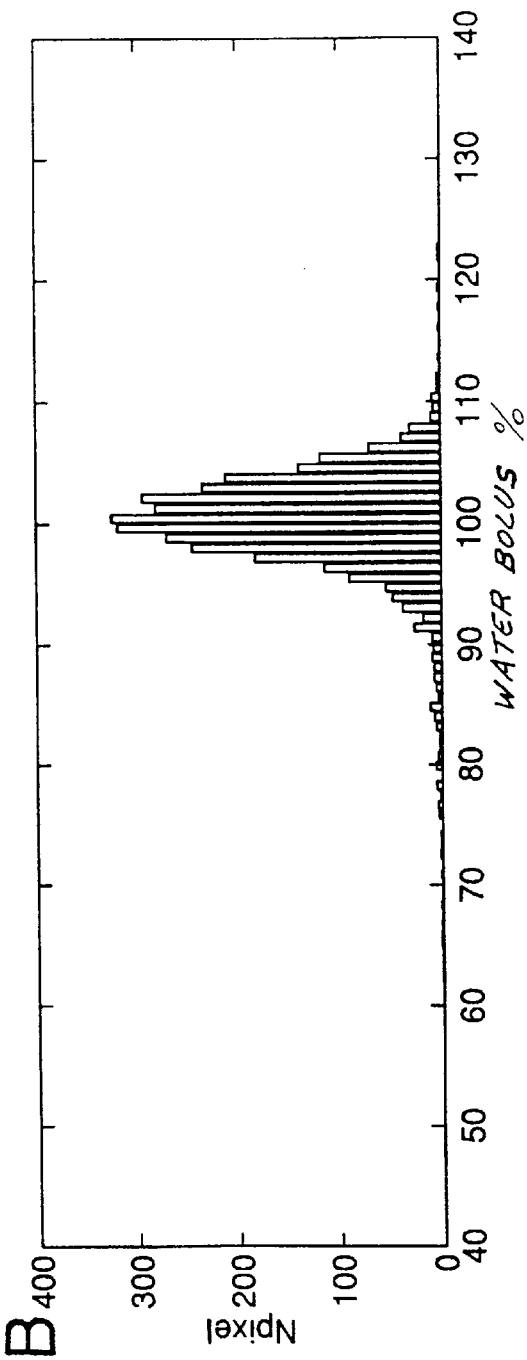
Figure 5A:
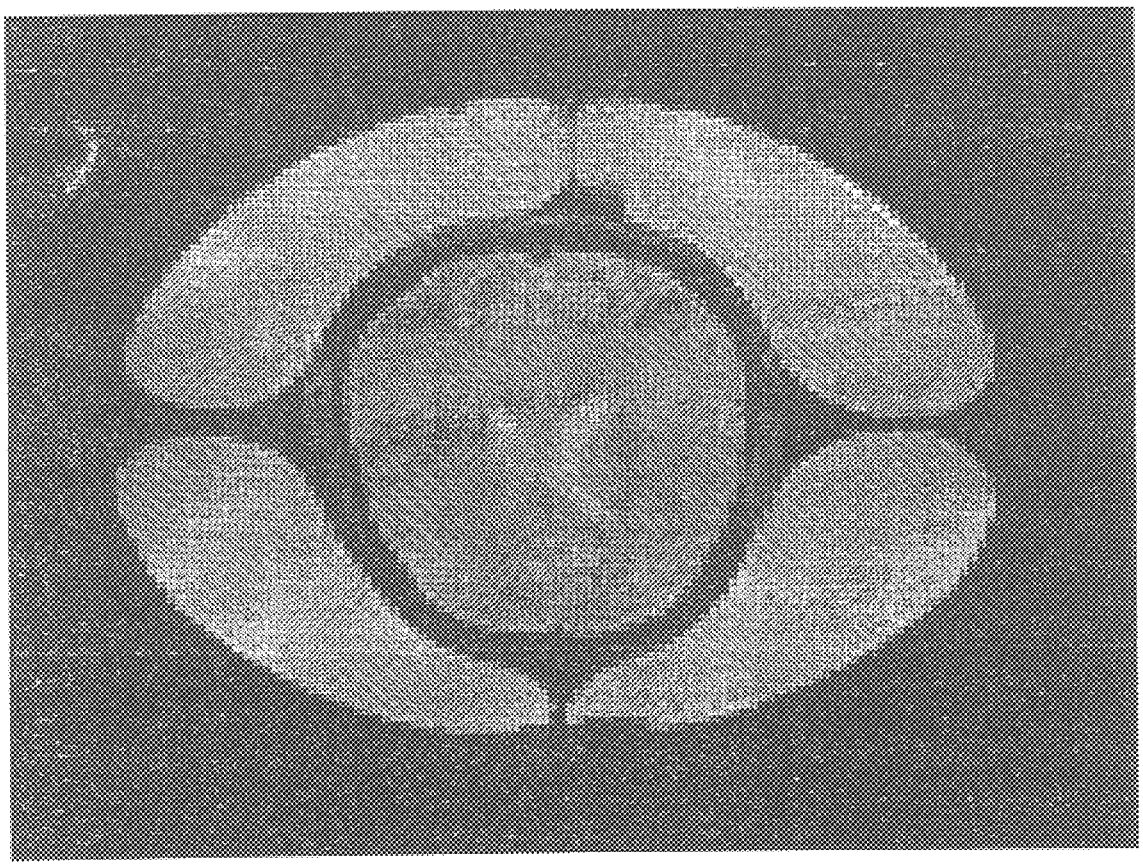
Figure 5B:
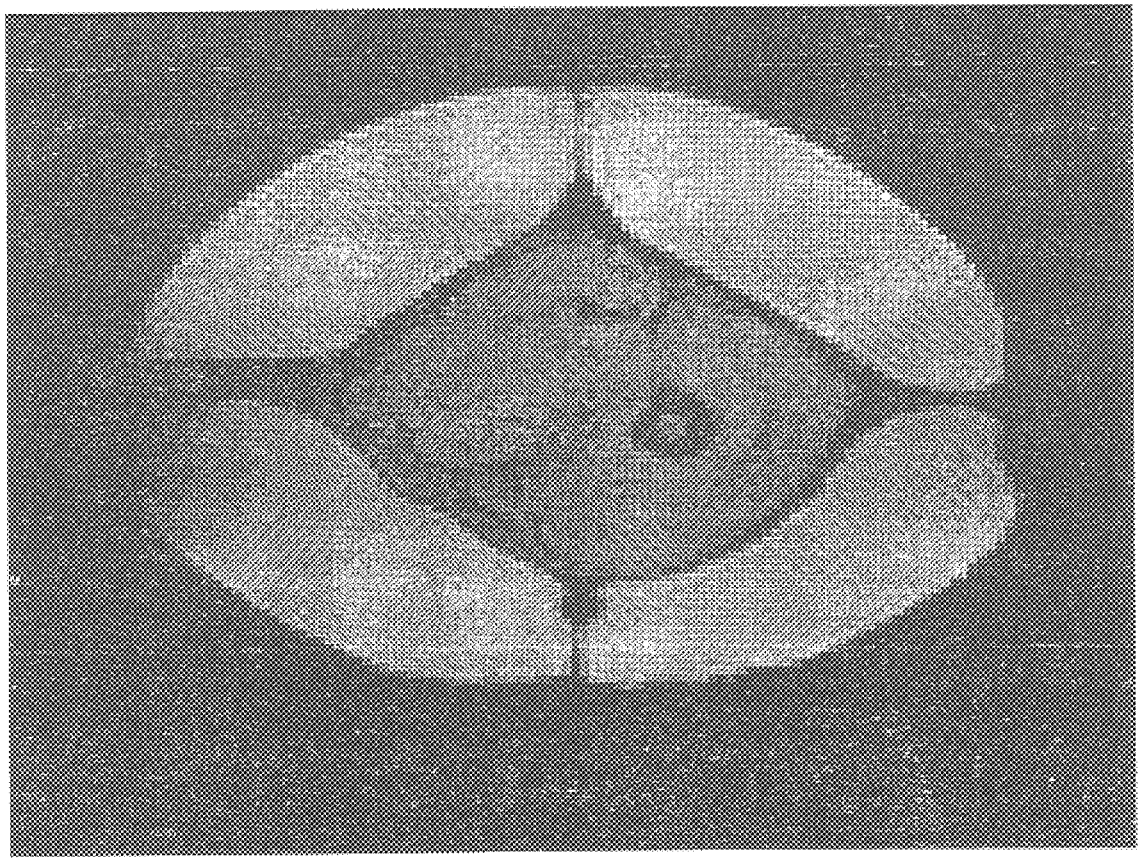

To check the reliability of the correction procedure, the effect on four soft plastics containers filled with water (boli) positioned all around the tissue to be imaged was checked: see in particular FIGS. 5A and 5B. The histograms of the pixel intensity from a large area of the bolus image, before and after the correction for non-uniformity, are shown in FIG. 3A and in FIG. 3B, respectively. The considerable decrease in the width of the distribution demonstrates the reliability of the procedure.

The four plastics bags located around the object to be imaged were used to estimate the water content. The measurements taken in tissues in fact need quantitative reference values. The maximum magnetization value (corresponding to 100% water content) was identified by the mean value of the signal of the water solution contained in the bags. Since the bags were wide enough and surrounded the whole object to be imaged (tissue or phantom) errors due to the different locations of the reference bags and of the object were reduced.

Testing of the Measurement and Processing Procedure

To test the applicability of the MRI method for determining the water content of tissues, the correlation between the water image intensity and the water content of some phantoms with various $H_2O/D_2O$ ratios was examined. Images of a cluster of six phantoms of about 30 ml volume, containing various $H_2O/D_2O$ ratios (20, 50, 70, 80, 90 and 100% $H_2O$, respectively) were acquired by the sequence used in the tissue scans. The phantoms were positioned at the centre of the transmitter/receiver coil to minimize non-uniformity effects. The average intensity of 50 pixels of each phantom was normalized to that of the phantom containing 100% of $H_2O$. Regression analysis of the data indicated that there was a linear relationship between the measured signal intensity and the water content (known), on the basis of the equation:

$$[SI]=0.97[H_2O]+1.2$$

where SI (level of grey scaled to a value of 100) is the signal intensity and $H_2O$ is the water content (as percentage of $H_2O$). The regression factor was r>0.99.

These results confirm the ability of the MRI to assign the water content quantitatively: in fact, the expected linear dependence was confirmed and the low intercept value also confirmed that there was no offset in the measurements.

To assess the quality of the proposed method, the images of two $H_2O/D_2O$ phantoms (A=100% $H_2O$; B approx. 83% $H_2O$) were acquired, with their locations inside the coil being varied six times, whilst the boli were kept fixed in the same position. The acquisition, processing and treatment procedure described was followed and was used for the scanning of the tissue. The size of the internal region subjected to test (about 17 cm diameter) was also the same, since the rigid cylinder used in a surrounding position to fix the boli around the tissue was identical.

Figure 4A:
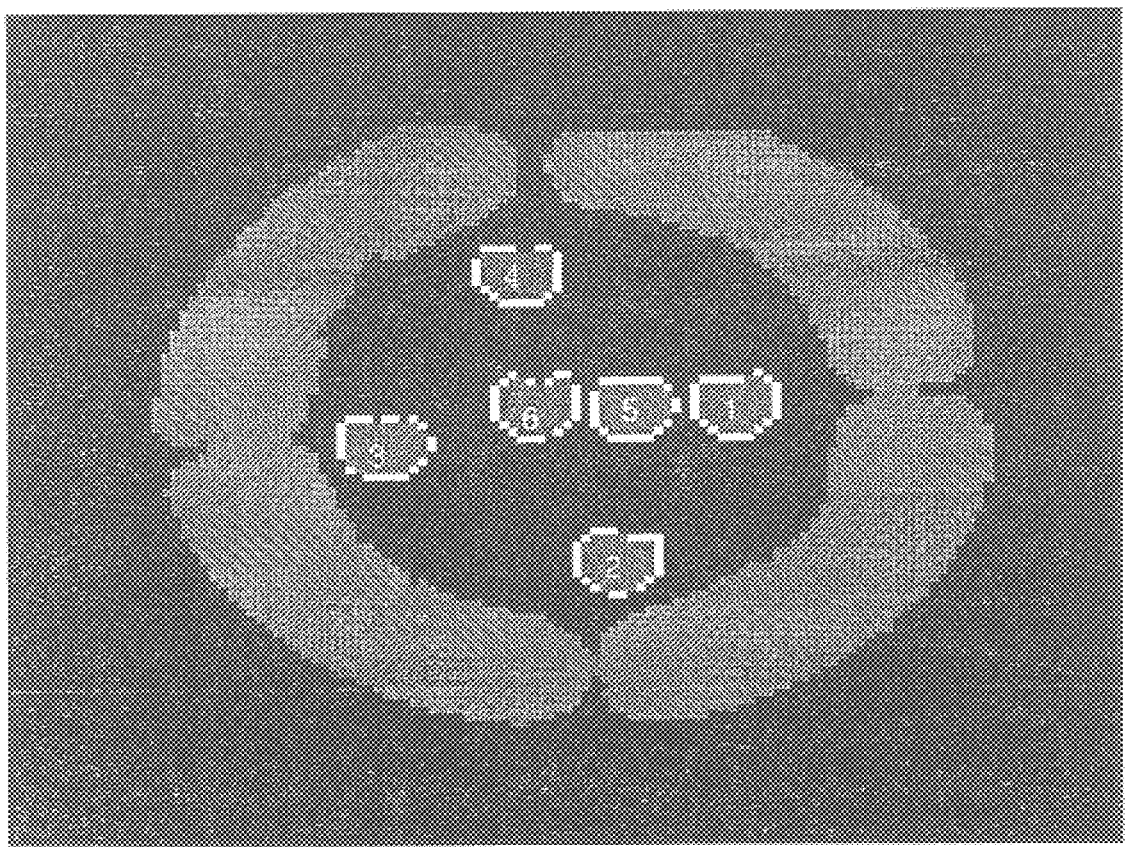
Figure 4B:
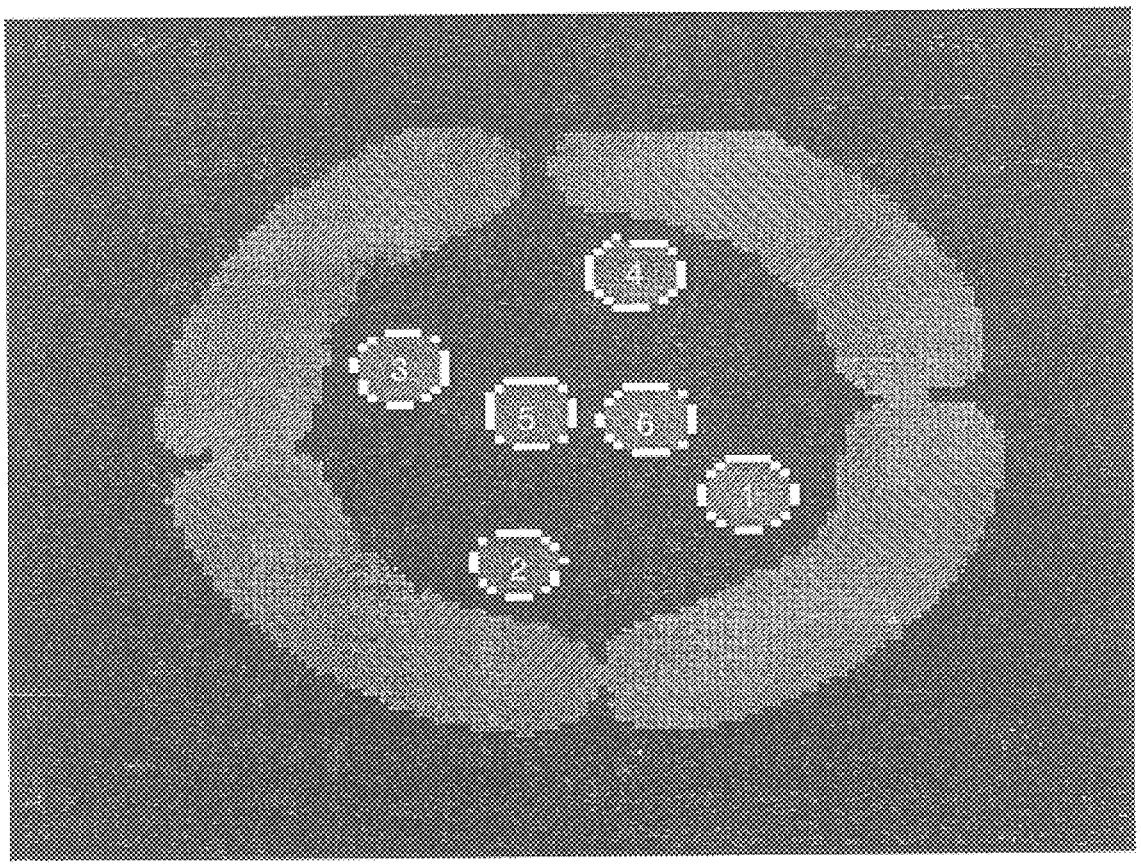

FIGS. 4A and 4B refer, respectively, to the six positions subjected to test for the phantoms A and B with the respective positions numbered. The boli used as reference are also indicated. In these figures all of the pixels of the phantoms which were above the background threshold level have been selected. Since partial volume effects would tend to underevaluate the pixels in the boundary regions of the phantoms, these were excluded. The remaining pixels thus appear grey inside the excluded white pixels.

Tables 2a (phantom A) and 2b (phantom B) give the estimated mean water-content percentage obtained by averaging the pixels described above. The standard deviation and the averaged number of pixels are also indicated. In the last row the total pixels of the six tested positions is shown.

TABLE 2a

| Position | Average | Std. dev. | N |
|---|---|---|---|
| 1 | 98 | 9 | 69 |
| 2 | 102 | 9 | 61 |
| 3 | 98 | 10 | 70 |
| 4 | 101 | 12 | 66 |
| 5 | 97 | 8 | 60 |
| 6 | 96 | 9 | 64 |
| TOTAL | 99 | 10 | 390 |

TABLE 2b

| Position | Average | Std. dev. | N |
|---|---|---|---|
| 1 | 83 | 8 | 52 |
| 2 | 83 | 10 | 54 |
| 3 | 81 | 10 | 58 |
| 4 | 82 | 8 | 52 |
| 5 | 79 | 8 | 51 |
| 6 | 81 | 10 | 54 |
| TOTAL | 81 | 9 | 321 |

Good agreement between the measurements and the true values (100% and 83% of $H_2O$) was obtained.

Evaluation of the Water Content of Tissues

The regions of the body analyzed were selected so as to be representative of a class of different tissues rather than of a specific treatment planning.

In particular, two anatomical structures were chosen to calculate permittivity maps: the head (at forehead level, where the cerebrospinal fluid (CSF) and white and grey matter regions are distinguishable) and the thigh (where the femoral bone, the muscular region and fatty tissue are present).

A multiple acquisition of the same slice at different TE was performed and the MRI data were processed pixel-by-pixel on the basis of the procedure described above.

FIGS. 5A and 5B give the MRI row data for the head (at TE=6 ms) and the thigh (at TE=10 ms) with reference to respective transverse sections.

The $T_2^*$ decay times differed significantly in the various tissues ($T_2^*$ in white and grey matter was about $70\pm15$ ms$^{-1}$, in muscle about $30\pm3$ ms$^{-1}$, and in the boli about $165\pm40$ ms$^{-1}$) which confirmed the advantage of performing a signal-decay correction procedure.

Figure 6A:
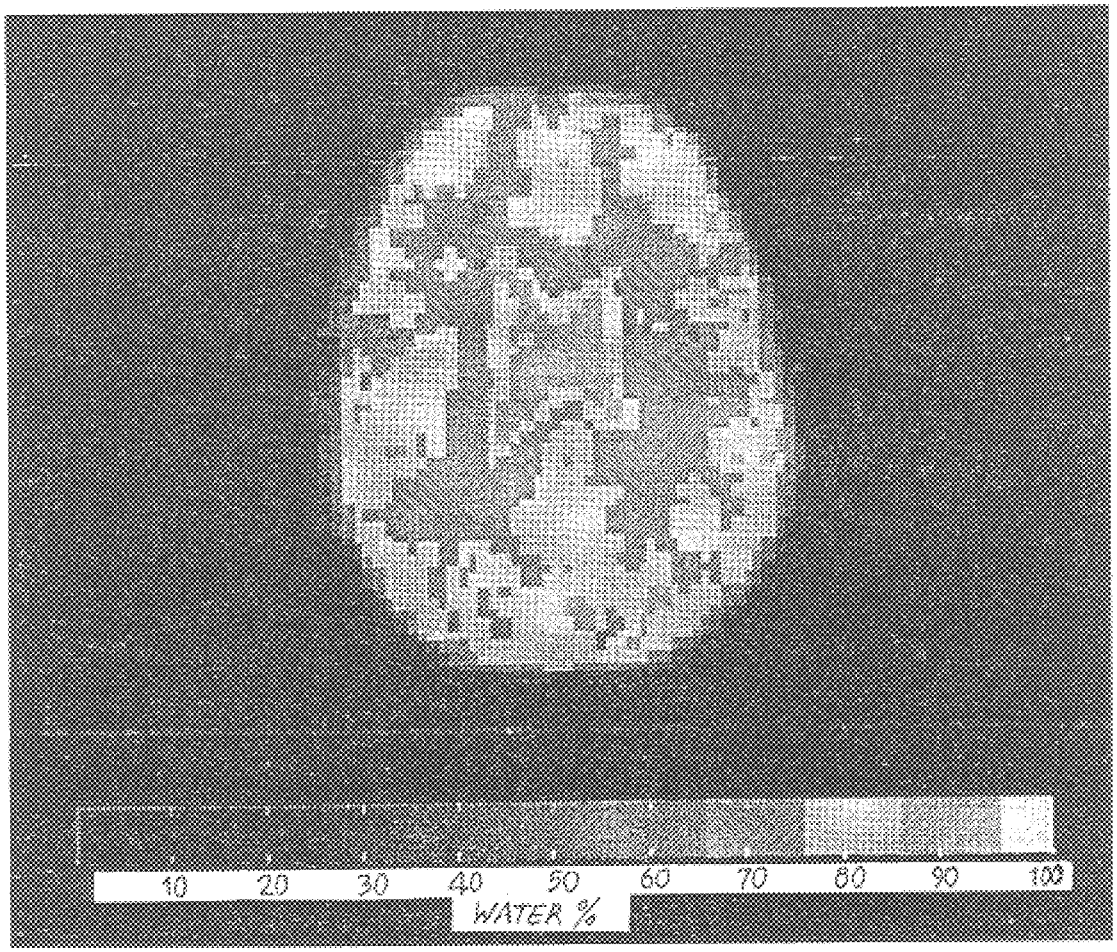
Figure 6B:
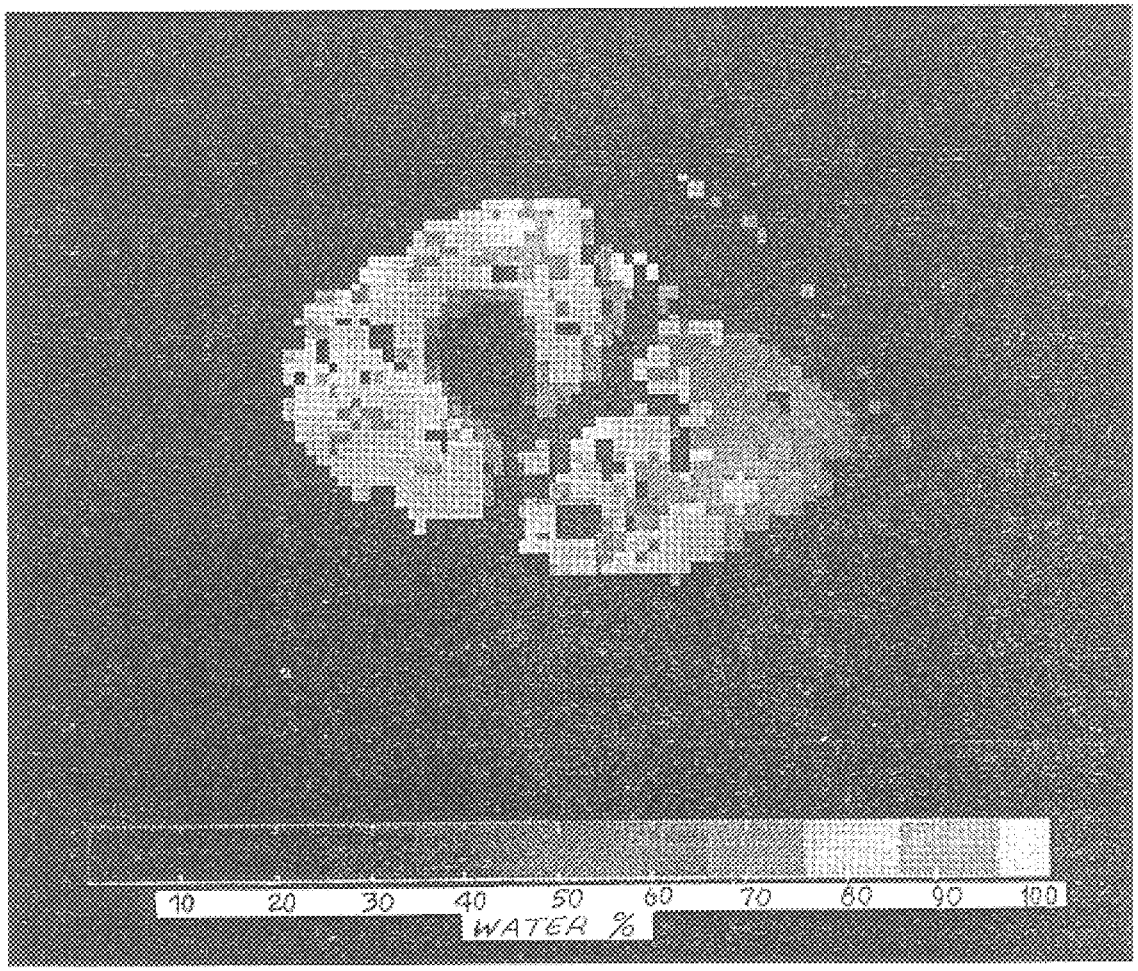

The MRI data were processed pixel-by-pixel in accordance with the procedure described above. FIGS. 6A and 6B show the estimated water content calculated from these data in a false-colour map. Fat tissue, segmented as described above, was evaluated pixel-by-pixel on the basis of the equation seen above in the thigh slice.

The data relating to the water content computed from the user-defined regions of interest are given in Table 3, in which the most relevant published data are also given.

TABLE 3

| Tissue | Water content as % | | | |
|---|---|---|---|---|
| | obtained by MRI | obtained by various techniques | | |
| Grey matter | 82 ± 3 | 84.0 | 84.4 | 84.30 |
| White matter | 69 ± 2 | 74.0 | 69.9 | 70–74 |
| Muscle | 75 ± 4 | 79.5 | 82.4 | 79.20 |
| fat | 17 ± 3 | 9.0 | 17.0 | |
| bone | 0 | | | 12.20 |
| bone marrow | 17 ± 2 | | 24 | |
| CSF | 91 ± 2 | | | 96–98 |

The values obtained by MRI were measured as described above and standardized with respect to the values of the phantom filled with an aqueous solution which surrounded the tissue. The data indicated are the average value and the standard error. The comparative values given in the right-hand three columns were processed by Schepps and Foster 1980, Brix et al., 1990, Mansfield and Morris 1982, Kauczor et al., 1993.

In FIG. 6A it is possible to distinguish two regions showing a homogeneous signal pattern: the region corresponding to white matter ($70\pm5\%$) and that corresponding to the grey matter ($80\pm5\%$). With regard to the CSF, the water-content value of the region was slightly underestimated. This underestimation is explained on the basis of the Ernst-Anderson equation (see R. Ernst and W. A. Anderson 1966), since the repetition time used (1.5 s) did not permit full relaxation of the magnetization of the water in the CSF region which is characterized by a long $T_1$, value (2.4–2.6 s) even though an excitation angle of 18° was used. In FIG. 6B, the region with a 75% water content indicates the muscle tissue, whilst the dark surrounding region indicates the fat-rich tissue. Table 3 shows a general agreement between the MRI data and those obtained by other methods, which confirms the reliability of what is proposed.

This agreement cannot be confirmed in the case of bone which may appear completely dark in the image. This anomalous behaviour can be explained on the basis of the multi-exponential decay characterized by a very short $T_2^*$ due to the different permeabilities of the bony trabeculae and of the intratrabecular space (Ford J. C. and Wherly F., 1991). At present, the currently-used whole-body magnetic resonance apparatus does not allow acquisition at very short TE values so it is impossible to perform a pixel-by-pixel multi-exponential analysis to calculate the value of $I_1$ for TE=0. Consequently, the bony regions preferably have to be located by a visual inspection by the operator, possibly with the supply of the permittivity values as input data for the FDTD simulation program for these regions.

As is known (Smith and Foster, 1980), electric permittivity and particularly its value at 0.1 GHz is related to the water content by the following equations:

$$\epsilon_{0.1} = \epsilon_w \frac{2\epsilon_w + \epsilon_p - 2P(\epsilon_w - \epsilon_p)}{2\epsilon_w + \epsilon_p + 2\left(\epsilon_w - \frac{\epsilon}{p}\right)} \qquad [2.1]$$

and $$\sigma_{0.1} = \sigma_w \frac{1-P}{1+\frac{P}{2}} \qquad [2.2]$$

where
- 1-P is the water content (P is the excluded volume of the suspended phase),
- $\epsilon_w$ is the relative permittivity of water,
- $\epsilon_p$ is the relative permittivity of the suspended phase, and
- $\sigma_{0.1}$ is the ionic conductivity of cytoplasm.

Figure 7A:
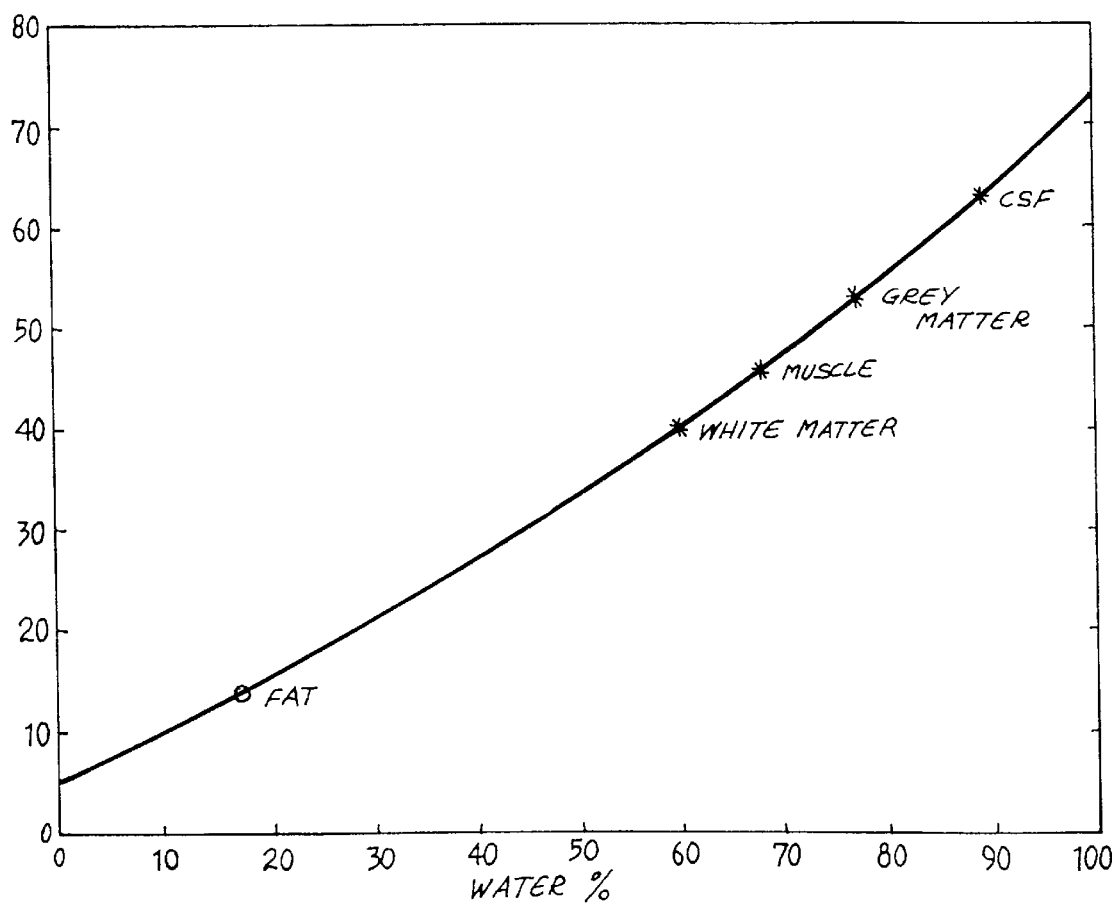
FIGS. 7A and 7B show the correlation between water content and relative electric permittivity (FIG. 7A) and electric conductivity (FIG. 7B) at a frequency of 1.0 GHz and, finally.
Figure 7B:
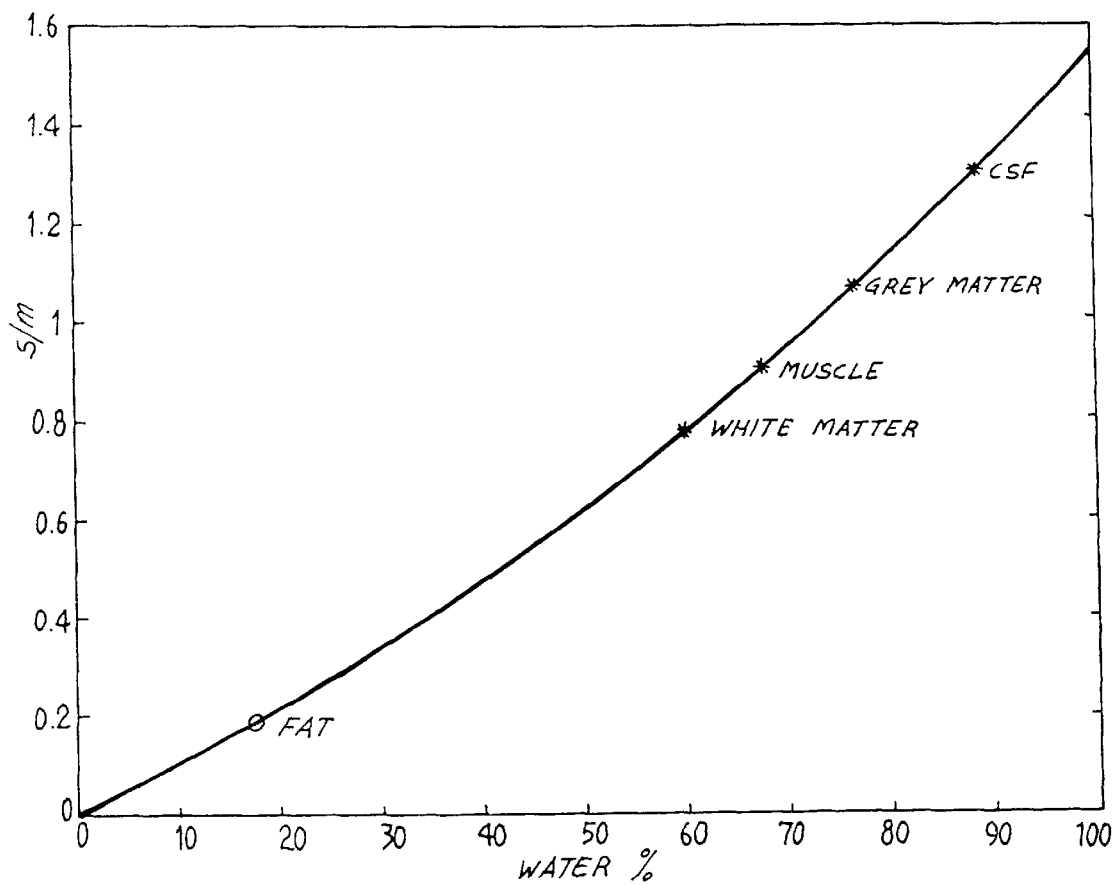

According to Smith and Foster 1985, the excluded volume P has to be increased by 30% in tissues with a high water content to account for bound water. This correction should not usually be applied in fat-rich tissues because of their non-polar suspended phase. On the basis of the equations given above, it is possible to estimate frequency-dependent complex permittivity in the range above 0.1 GHz as a function of the water content (see in particular the continuous line in FIGS. 7A and 7B). In these figures, the electric permittivity and electric conductivity values of five tissues as calculated from the Smith and Foster equations on the basis of the water content obtained from the magnetic resonance data in accordance with the method described above, are indicated.

From the foregoing, it is clear that the solution according to the invention enables reliable maps of water content to be obtained from magnetic resonance data; in particular, although the examples mentioned above relate to two single slices in which a set of representative tissues can easily be recognized (this choice having being dictated by a desire to limit the exposure of volunteers during tests), it is possible to use multi-slice protocols to map a whole volume without increasing acquisition times. Naturally, the acquisition time (about 12 minutes to acquire four different echo times) is reduced if a multi-echo gradient-echo sequence is available. Furthermore, a single echo time may be adequate if a shorter echo time is used so that the effects of the different decay can be ignored.

Permittivity data can be extrapolated from the water-content maps. These maps have a high spatial resolution. This achieves considerable savings in terms of operator time, to the benefit of the automatic planning of hyperthermic therapy in clinical practice.

Synopsis of the References Quoted in the Description

Axel L., Costantini J., and Listerud J., 1987, Intensity correction in surface-coil MR imaging, AJR 148 418–420.

Bondestam S., Lamminen A., Komu M., Poutanen V. P., Alanen A., and Halavaara J., 1992, Tissue characterization by image processing subtraction: windowing of specific T1 values, Magn. Reson. Imaging 10 989–995.

Borrello J. A., Chenevert T. L., Meter C. R., Aisen A. M., and Glazer G. M., 1987, Chemical shift-based true water and fat images: regional phase correction of modified spin-echo MR images, Radiology 164 531–537.

Brix G., Heiland S., Bellemann M. E., Koch T., and Lorenz W. J., 1993, MR imaging of fat-containing tissues: Evaluation of two quantitative imaging techniques in comparison with localized proton spectroscopy, Magn. Reson. Imaging 11 977–991.

Brix G., Schad L. R., and Lorenz W. J., 1988, $^1$H spectroscopic imaging using a modified Dixon method, Magn. Reson. Imaging 6 617–622.

Brix G., Schad L. R., and Lorenz W. J., 1990, Evaluation of proton density by magnetic resonance imaging: phantom experiments and analysis of multiple component proton transverse relaxation, Phys. Med. Biol. 35 53–66.

Condon B. R., Patterson J., Wyper D., Jenkins A., and Hadley D. M., 1987, Image non-uniformity in magnetic resonance imaging: its magnitude and methods for its correction, The British J. of Radiol. 60 83–87.

Dimbylow P. J. and Mann S. M., 1994, SAR calculations in an anatomically realistic model of the head for mobile communication transceivers at 900 MHz and 1.8 GHz, Phys. Med. Biol. 39 1537–1553.

Dixon W. T., 1984, Simple proton spectroscopic imaging, Radiology 153 189–194. Ernst R. R. and Anderson W. A., 1966, Rev. Sci. Instrum. 37 93.

Ford J. C. and Wherly F. W., 1991, In vivo quantitative characterization of trabecular bone by NMR interferometry and localized proton spectroscopy, Magn. Reson. Med. 17 543–551.

Glover G. H., 1991, Multipoint Dixon technique for water and fat proton and susceptibility imaging, JMRI 1 521–530.

Hornsleth S. N., Mella O., Dahl O., 1996, A new CT segmentation algorithm for finite difference based treatment planning systems, Hyperthermic Oncology Edited by Franconi G., Arcangeli G., and Cavaliere R., Tor Vergata Medical Physics monograph series.

James B. J. and Sullivan D. M., 1992, Direct use of CT scans for hyperthermia treatment planning, IEEE Trans. Eiomed. Eng. 39 845–851.

Kauczon H. U., Brix G., Dietl B., Jarosch K., Knopp M. V., and van Kaick G., 1993 Bone marrow after autologous blood stem cell transplantation and total body irradiation: magnetic resonance and chemical shift imaging, Magn. Reson. Imaging 11 965–975.

Lodes C. L., Flemlee J. P., Ehman R. L., Sehgal C. M., Greenleaf J. F., Glover G. H. and Gray J. E., 1989 Proton MR chemical shift imaging using double and triple phase contrast acquisition methods, J. Comput. Assist. Tomogr. 13 855–865.

Mansfield P. and Morris P. G., 1982 Advances in Magnetic Resonance, Supplement 2, Adademic Press, New York.

Pontalti R., Cristoforetti L., and Cescatti L. 1993 The frequency dependent FDTD method for multi-frequency results in microwave hyperthermia treatment simulation, Phys. Med. Biol. 38 1283–1298.

Schepps J. L. and Foster K. R., 1980, The UHF and microwave dielectric properties of normal and tumor tissues: variation in dielectric properties with tissues water content, Phys. Med. Biol. 25 1149–1159.

Song S. M., Napel S., Pelc N. J., and Glover G. H., 1995 Phase unwrapping of MR phase images using poisson equation, IEEE Trans., Image Processing 4 667–676.

Smith S. R. and Foster K. R., 1985, Dielectric properties of low water content tissues, Phys. Med. Biol. 30 965–973.

Szumowski J., Coshhow W. R. and Fang L., 1994, Phase unwrapping in the three-point Dixon method for fat suppression, MR imaging Radiology 192 555–561.

Wherly F., Perkins T., Shimakawa and Roberts F., 1987, Magn. Reson. Imaging 5 157–187.

Wicks D. A. G., Barker G. J., and Tofts P. S., 1993, Correction of intensity non-uniformity in MR images of any orientation, Magn. Reson. Imaging 11 183–196.

What is claimed is:

1. A method of obtaining electric permittivity maps from magnetic resonance images, comprising the steps of:
   scanning tissue to obtain magnetic resonance images,
   subjecting the magnetic resonance images to quantitative analysis of water content of individual regions of the images so as to create corresponding first maps indicative of respective water-content values, and
   associating respective electrical permittivity values with water content values of the first maps and generating second maps corresponding to electric permittivity maps.

2. The method of claim 1, wherein said images contain portions relating to fat tissues, the method further comprising the steps of:
   locating the fat tissues within the images so as to identify respective regions of fat tissue in the images, and
   determining, for the respective regions of fat tissue, respective values of the water content to be used for association with respective electric permittivity values.

3. The method of claim 2, further comprising locating the fat tissues by segmentation on the basis of a thresholding operation.

4. The method of claim 2, further comprising locating the fat tissues by segmentation on the basis of a thresholding operation followed by the assignment of tabulated electric permittivity values to the segmented region.

5. The method of claim 4, further comprising acquiring two images (M1, M2) corresponding to hyperintense (M1) and hypointense (M2) fat signals, respectively, then subtracting one image (M2) from the other (M1) and then carrying out the thresholding on the difference image.

6. The method of claim 5, further comprising measuring amplitude modulation of a signal induced by chemical shift as a chemical shift phenomenon.

7. The method of claim 6, comprising the step of measuring signal intensity as a function of dephasing time I(TE) expressed in accordance with equation $$I(TE) = \left| \sum_i I_i \right| = \sqrt{\sum_i \sum_j I_i I_j \cos[\Delta\omega_{ij} TE + \Delta\phi_{ij}]} \qquad [1.1]$$

where $I_i$ is the quadrature signal of the i-th spectral component, $\Delta\omega_{ij}$ is the frequency difference between the components i and j, and $\Delta\phi_{ij}$ is the initial phase between the i-th component and the j-th component, $I_i$ can be expressed as $$I_i = I_0 \exp(-TE/T^*_{2i}) \qquad [1.2]$$

and represents the $T^*_2$-weighted modulus signal amplitude of the i-th component with the summation extending over all of the spectral components.

8. The method of claim 7, comprising the step of taking into consideration solely the water spectral component and one fat spectral component, performing an estimation on the basis of images acquired at a plurality of echo times (TE), then effecting a multi-parameter fit on the basis of a non-linear curve, and then computing the tissue water-content images.

9. The method of claim 2, further comprising obtaining the respective water content values of the fat-tissue pixels by a chemical shift imaging (CSI) technique.

10. An automatic system for obtaining water-content and electric permittivity maps from magnetic resonance images, comprising:

magnetic-resonance detection means for generating signals corresponding to magnetic resonance images, and processing means sensitive to the signals corresponding to the magnetic-resonance images and programmed to implement the steps of:

subjecting the magnetic resonance images to quantitative analysis of water content of individual regions of the images so as to create corresponding first maps indicative of respective water-content values, and associating respective electrical permittivity values with the water content values of the first maps and, generating second maps corresponding to electric permittivity maps.

* * * * *